United States Patent [19]

Trafford

[11] 4,380,358
[45] Apr. 19, 1983

[54] LAMP SOCKET

[75] Inventor: Larry F. Trafford, Owen Sound, Canada

[73] Assignee: General Signal Corporation, Stamford, Conn.

[21] Appl. No.: 213,294

[22] Filed: Dec. 5, 1980

[51] Int. Cl.³ .............................................. H01R 9/12
[52] U.S. Cl. .............................. 339/17 D; 339/125 L; 339/119 L
[58] Field of Search ............. 339/17 C, 17 D, 125 R, 339/125 L, 88, 119 R, 119 L

[56] References Cited

U.S. PATENT DOCUMENTS

| | | | |
|---|---|---|---|
| 2,825,038 | 2/1958 | Woofter | 339/17 D |
| 2,869,097 | 1/1959 | Stuart | 339/119 L X |
| 3,206,708 | 9/1965 | Fitzgerald | 339/17 D |
| 3,621,445 | 11/1971 | Horecky | 339/17 C |
| 4,183,610 | 1/1980 | Key | 339/17 C X |

FOREIGN PATENT DOCUMENTS 1190618  5/1970  United Kingdom ............ 339/127 R

Primary Examiner—Willie G. Abercrombie
Attorney, Agent, or Firm—George W. Killian

[57] ABSTRACT

A lamp socket adapted for mounting on a printed circuit board or other support member. The lamp socket comprises a non-conducting housing having a first contact member captured in cooperative relationship therewith such that one part of the contact member is positioned to make electrical contact with one terminal of a lamp inserted in the socket. The first contact member includes a second part for projecting through an opening in the base of the socket for making an external electrical connection therewith. A second contact member is captured in cooperative relationship with the housing and includes one part that is positioned to make contact with another terminal of a lamp inserted in the socket. The second contact member includes a second part for projecting through an opening in the base of the socket for making an external electrical connection therewith. One of said contact members is captured by a latch member formed as a part of said housing. By simple modification the housing could be modified for panel mounting and electrical connection by wire wrap techniques. By appropriate formation a part of one contact member may be configured to retain the socket on a printed circuit board prior to the soldering thereof.

18 Claims, 9 Drawing Figures

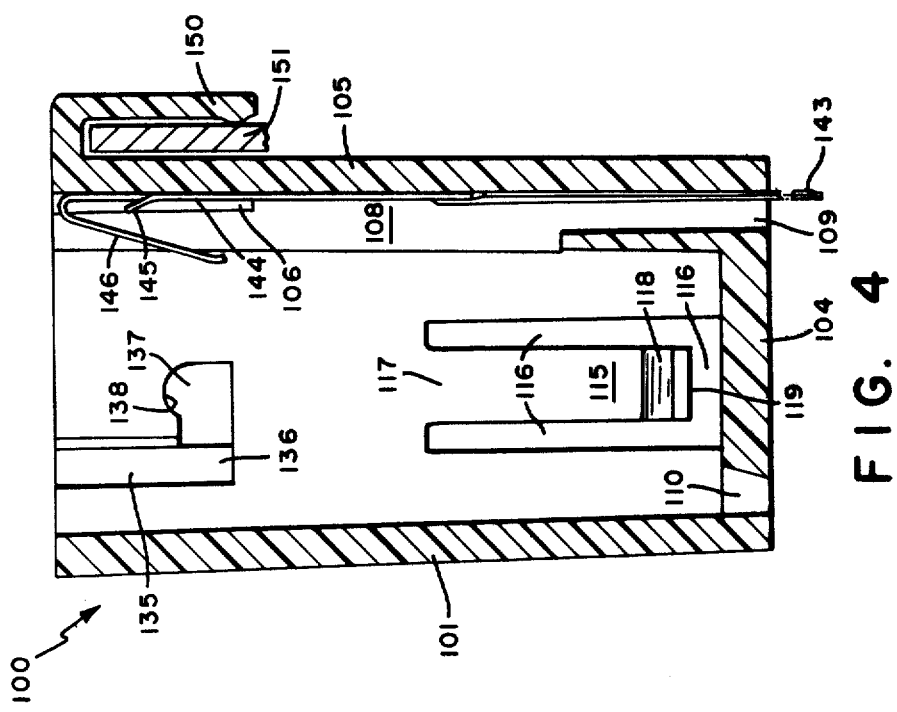
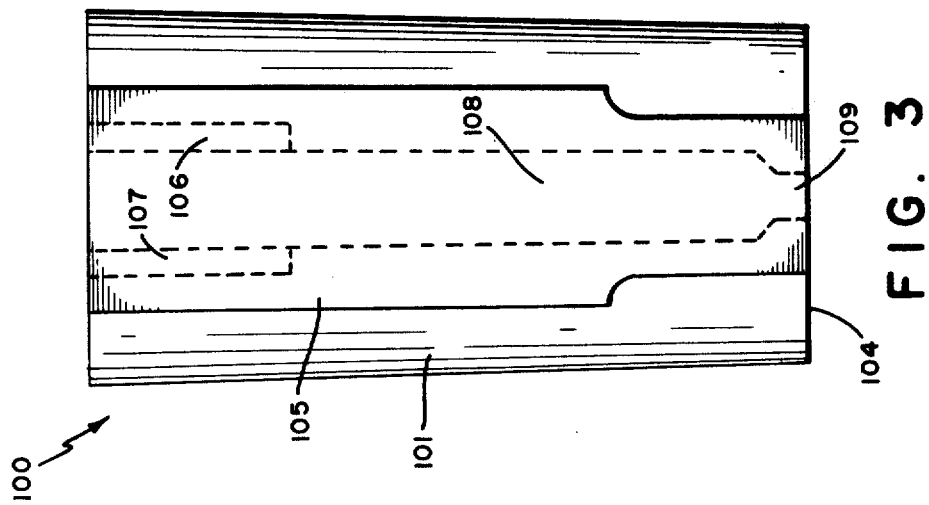

LAMP SOCKET

BACKGROUND OF THE INVENTION

The present invention relates to an improvement in lamp sockets such as may be used for mounting on a printed circuit board, or attachment to a chassis member or any of the other multitude of applications wherein it is necessary to provide a lamp socket. Lamp sockets of the class contemplated are frequently provided for low voltage applications such as providing an on-off indication, instrument panel illumination, supervisory signals, and numerous other applications. Typical lamp sockets of the class under consideration are of the order of an inch long and a half inch wide. They may accommodate bayonnette-style lamps or lamps having any other conventional base.

DESCRIPTION OF THE PRIOR ART

There are numerous patents in the prior art relating to lamp sockets having one or more characteristics in common with the structure of the present invention. However, none are known which alone, or in combination with others, anticipates this invention as claimed or renders it obvious. The following patents are representative:

| | | | |
|---|---|---|---|
| U.S. Pat. No. 2,283,689 | May 1942 | Mitchell | 173-328 |
| U.S. Pat. No. 2,443,743 | Jun 1948 | McNabb | 173-328 |
| U.S. Pat. No. 2,470,280 | May 1949 | Ackerman | 173-328 |
| U.S. Pat. No. 2,710,386 | June 1955 | Hall | 339-101 |
| U.S. Pat. No. 2,825,038 | Feb 1958 | Woofter | 339-17 |
| U.S. Pat. No. 3,001,165 | Sept 1961 | Woofter et al | 339-17 |
| U.S. Pat. No. 3,308,420 | Mar 1967 | FitzGerald | 339-176 |
| U.S. Pat. No. 3,805,211 | Apr 1974 | Moore | 339-14R |
| U.S. Pat. No. 4,072,384 | Feb 1978 | Moore | 339-59L |
| U.S. Pat. No. 4,076,358 | Feb 1978 | Taormina et al | 339-17D |

The '743, '420, and '384 patents are typical structures which have moving members below the bottom of the housing and therefore are not suitable for mounting on a printed circuit board as shown in the new structure. Patents '038, '165, and '358 all provide for mounting on a printed circuit board but not with the same convenience and facility as the present structure. The '280, '038, and '211 patents all disclose plastic bodies but none provide the combination of features claimed.

Typical prior art devices are constructed with a conducting shell which is in electrical contact with the base of the lamp when it is placed in the lamp socket. The second connection to the lamp is typically made by means of a spring-biased contact post which is urged upward towards the lamp but whose upward travel is limited. In response to insertion of the lamp, the contact post is moved downwardly, against the bias of the spring, and may project through the base of the housing. The assembly requires insulating members to electrically insulate the central post from the lamp socket housing. In a typical assembly, there may be of the order of a dozen separate components that are assembled to make the complete lamp socket.

Assembly of the prior art lamp sockets, with their numerous parts, is expensive and time consuming and requires an extensive inventory of components.

When lamp sockets of the prior art are mounted on a printed circuit board, it is necessary to provide adequate clearance between the base of the lamp socket and the printed circuit board in order to allow depression of the spring biased contact member which moves in response to the insertion of a lamp. An alternate technique is to provide an extra hole in the printed circuit board in order to accommodate the motion described above. This technique of providing a hole in the printed circuit board serves admirably but creates a wiring constraint as the wiring of the printed circuit wires are arranged on the board. That is, because of the hole, a printed foil conductor cannot be accommodated in that area.

Typical lamp sockets of the prior art, which are designed for mounting on a printed circuit board, provide terminals which press fit into the holes of the printed circuit board for assuring that the lamp socket does not fall off the printed circuit board between the time that it is associated therewith and the soldering is complete. Unfortunately, because of the press fit, the insertion of the lamp socket will occasionally loosen the surrounding foil and cause problems.

Another difficulty of the prior art lamp socket resides in the fact that the housing is typically made of a conducting material and comprises one of the electrical connections to the lamp. When components are closely spaced, there is a possibility of an inadvertent short circuit between the lamp socket and some other member and/or the frame into which the printed circuit board is mounted. To foreclose this possibility, it is common to employ an additional part comprising an insulating sleeve which fits over the lamp socket housing.

SUMMARY OF THE INVENTION

The lamp socket of the present invention overcomes the difficulties recited with respect to typical prior art lamp sockets. The lamp socket of the present invention may be constructed with only three components and still avoid all of the inconveniences and problems associated with the described prior art lamp sockets. The body of the new and improved lamp socket comprises a molded nonconductor; and therefore, there is no need to provide a covering sleeve for insulating the lamp socket from adjacent members. Furthermore, because the body is nonconducting, other insulating members are not required to electrically insulate the two contact members from each other and/or the body.

In addition, the lamp socket of the present invention does not employ a structure having a member which projects through the base of the housing in response to insertion of the bulb. Accordingly, a lamp socket of the present design may be mounted on a printed circuit board without requirement for clearance or a hole in the printed circuit board to accommodate a moving member.

By providing a simple and predetermined configuration of at least one of the contact members, which is to make connection to the printed circuit board, means are provided for mounting the lamp socket of the present invention on a printed circuit board without using a press fit which might loosen the foil on the printed circuit board. More specifically, the present structure employs a preformed curvature on at least one of the contact members in a manner that causes it to grip the printed circuit board.

One contact member comprises, in one embodiment, a compression spring which is conically-shaped and which is secured within the nonconductive housing by means of latches formed in the housing and which engage a turn of the coil spring to secure and confine it in a predetermined relationship with the housing so that appropriate electrical contact is assured between the lamp and the spring.

A second contact member, which may be formed from flat stock, is inserted in a groove formed in the periphery of the lamp socket housing. The contact member mates with the groove and includes suitable means, such as a barb, for locking the contact member in a predetermined position with respect to the housing. One portion of the contact member is preformed to make contact with the base of the lamp when it is inserted in the housing and another portion of the contact member projects through a hole in the base of the housing to provide for external wiring.

If desired, the portions of the contact members which project through holes in the base of the housing for making connection with external wiring, may be configured to accommodate secure electrical connection when wire wrap techniques are employed.

By simple modifications in the housing, other mounting techniques may be employed.

It is an object of the invention to provide a new and improved lamp socket.

It is a more specific object of the invention to provide a new and improved lamp socket which is fabricated from a reduced number of parts while still providing all the features and desirable characteristics of prior art structures without incorporating the above mentioned and other disadvantages of prior art structures.

It is an even more specific object of the invention to provide a lamp socket which has a housing fabricated of insulating material and which is configured to capture two contact members therein, each of which has a first portion for making contact with the lamp to be inserted in the socket and each of which has a second portion for projecting through respective openings in the base of the lamp housing to provide electrical connection.

It is another object of the invention to provide a housing which has incorporated therewith, as an integral part thereof, latch members for capturing and securing one of the contact members in a predetermined position.

It is another object of the invention to provide a housing which includes a guideway for positioning and capturing a second contact member.

It is another object of the invention to provide a lamp socket which may be modified or adapted for a wide variety of mounting techniques.

BRIEF DESCRIPTION OF THE DRAWING

To permit an incisive and detailed analysis of the structure and characteristics of the invention, a variety of figures are provided showing various aspects of the structure. The drawing discloses a specific form of the structure and some suggestions of alternate structures. The drawing is not meant in any way to delimit the scope of the invention; it is, rather, provided as an aid to obtain an understanding of the invention. In accordance with convention, like elements are given identical identification numerals in all views. In the drawing:

FIG. 3 comprises a side view of one embodiment of the invention;

FIG. 4 comprises a section view taken along the line 4—4 of FIG. 1 and an alternate mounting method;

Figure 1:
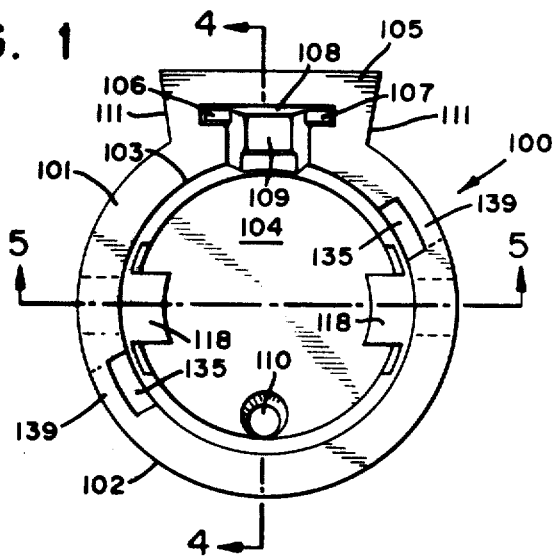
FIG. 1 comprises a top view of one embodiment of the invention.

In order to illustrate alternate structures and aspects of the invention, some views have been modified in order to show alternate structures.

It is believed that the various objects and advantages of the structure, in addition to those cited hereinabove, will become apparent as the following description proceeds.

DESCRIPTION OF THE PREFERRED EMBODIMENT

While the lamp socket of the present invention is contemplated as being used primarily with low voltage and low wattage lamps which may typically have an overall length of the order of an inch and a base having a diameter of the order of ⅛ of an inch, it should be understood that the lamp socket may be constructed to accommodate lamps of other size. Furthermore, although most of the figures of the drawing illustrate a lamp socket adapted to accommodate lamps incorporating a bayonette-style base, it shoud be understood that the lamp socket housing could readily be modified and adapted to accommodate any other style of lamp base.

Figure 2:
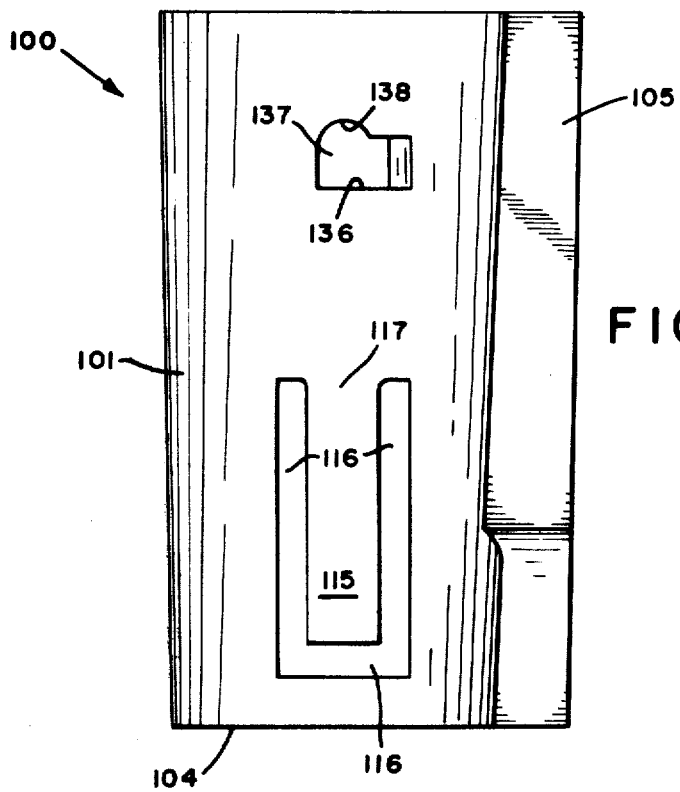
FIG. 2 comprises a front view of one embodiment of the invention.
Figure 8:
FIG. 8 comprises a cross section of FIG. 6 taken on the line 8—8.

Considering now more specifically FIGS. 1, 2, and 3, they will be seen to comprise respectively a top, front, and side view of a lamp socket incorporating the invention. It is anticipated that the lamp socket may be most economically and expeditiously fabricated by a molding process; and therefore, the lamp socket is illustrated as having an appropriate draft to facilitate molding. The lamp socket housing is illustrated generally as 100 and, as may be seen, comprises a generally cylindrical member 101 having an outer periphery 102 and an inner periphery 103. The cylindrical lamp socket housing is open at the top and includes a closed bottom 104. As may be most clearly seen in FIG. 1, the lamp socket housing 100 is not completely cylindrical in shape and includes an appendage 105 which, as will be explained more fully hereinbelow, is provided for accommodating a contact member illustrated more fully in FIGS. 4, 6, 7, and 8. The appendage 105 includes a T-shaped opening having left and right guideways designated 106 and 107, respectively. As may be seen more clearly in FIG. 3, the left and right guideways 106 and 107 do not extend all the way to the bottom 104. However, between the left and right guideways 106 and 107 is an elongated slot 108 which, it will be seen, extends to the bottom of the lamp socket housing 100. At the bottom end of the elongated slot 108 is a hole 109. As will be seen more fully hereinafter, the hole 109 is provided for the contact member shown more fully in FIGS. 6, 7, and 8. In the bottom 104, there is a second hole 110 which, as will be discussed more fully hereinafter, provides an opening for a second contact member which projects through the bottom 104. Several of these elements are also indicated in the section views, FIGS. 4 and 5. The depth of the guideways 106 and 107 are clearly illustrated in FIG. 5 and the length of the elongated slot 108 is most clearly shown in FIG. 4.

Figure 5:
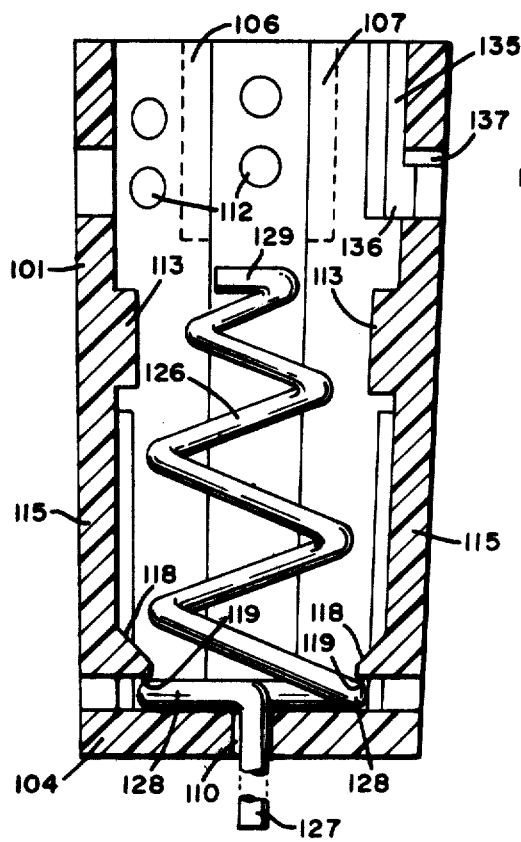
FIG. 5 comprises a section view taken along the line 5—5 of FIG. 1 and additionally illustrates a housing for accommodating an alternate type of lamp base.

Considering now the front view, FIG. 2, and comparing it with FIGS. 1 and 5, it will be seen that the housing 100 includes a latch member 115 which comprises an elongated finger formed in the housing 100 and surrounded on three sides by an opening 116. Accordingly, the latch member 115 can flex somewhat in the area designated 117. That is, the lamp socket housing 100 is fabricated of a nonconducting material which is capable of at least some deformation without fracture. As may be seen most clearly in the section view of FIG. 5, the latch members 115 include cam surfaces 118 and locking tabs 119.

Figure 9:
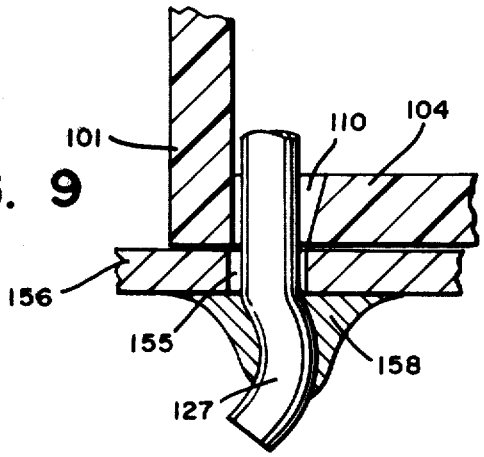
FIG. 9 comprises view of a portion of one of the contacts and its preformed configuration.

Considering now more specifically FIG. 5, it will be seen that it includes a contact member 126 comprising a spring which, to avoid complicating the drawing, it not shown in other figures. It may be seen that the contact member 126 comprises a spring having a plurality of turns, each successive one of which usually has a smaller diameter than the one below it. In a typical structure, the contact member 126 may have a spring height of the order of 0.6 inches with an ID of the order of 0.100 inches and an OD at the bottom of the order of 0.330 inches. This typical spring contact member will deflect approximately 0.1 inches with a 5 lb. load. As may be readily visualized, the contact member 126 will serve to make electrical contact with the central part of the base of a lamp inserted into the lamp socket housing 100. The contact member 126 includes a terminal 127 which projects through the hole 110 in the base 104 of the housing 100. The terminal 127 may project through a hole on a printed circuit board if the lamp socket 100 is mounted on a printed circuit board 156 as illustrated in FIG. 9, and thereafter by conventional techniques, solder 158 may be applied to complete an electrical circuit between the terminal 127 and the foil on the printed circuit board 156. During assembly, the contact member 126 will be guided into the lamp socket housing 100 so that the terminal 127 will project through the hole 110. As the spring is inserted in the housing 100, the lower coil 128 will contact the cam surfaces 118 and push the latch member 115 outward allowing the lower coil 128 of the contact member 126 to be pushed below the locking tabs 119 as illustrated in FIG. 5. When the lower coil 128 is in the position illustrated in FIG. 5, the latch members 115 will return to their normal position and the locking tabs 119 will retain the contact member 126 in position. It should be further understood that the latch members 115 and the associated locking tabs 119 capture and support the contact member 126 so that its upper coil 129 is approximately centered within the cylindrical housing 101. This assures proper electrical contact with the lamp when inserted.

A widely used type of lamp for use in sockets of the class being described is known in the industry as a bayonette lamp. Bayonette lamps are characterized by having a metallic base to which one of the terminals of the filament is connected. The metallic base has two studs projecting therefrom at diametrically opposed positions. A bayonette lamp is inserted in a lamp socket housing, such as housing 100 by orienting the studs of the lamp so that they will align with appropriately positioned slots 135 as best seen in FIGS. 1 and 4. After the studs of the lamp have reached the bottom 136 of the slot 135, the lamp being inserted may be rotated angularly about its longitudinal axis to position the studs away from the slot 135 and into the locking chamber 137, best seen in FIGS. 2 and 4. Typically, the locking chamber 137 includes an upper arch 138 against which the stud of the lamp rests. Because of the configuration of the arch 138 and the pressure of the contact member 126 on the bottom of the lamp, the lamp is held in position and rotation is inhibited without a preliminary depression of the lamp. In order to avoid unduly cluttering the figures of the drawing, no lamp is shown as it is believed that those familiar with lamps and lamp sockets of the class being described are well acquainted with the insertion, support, and removal of such lamps. It should be observed that if it is desired to provide extra strength for the housing member 100 that the slots 135 do not need to penetrate the entire thickness of the cylinder 101. More specifically, a portion 139, as best seen in FIG. 1, covers the slots 135 thereby providing additional strength and support for the housing 100. As seen in FIG. 2, the locking chamber 137 may penetrate the cylinder 100. A reason for providing this penetration is to facilitate fabrication of the lamp socket housing 100 by a molding process. That is, the penetration at the locking chamber 137 provides a means for supporting a core in the interior of the cylinder 101 as the lamp socket housing 100 is being molded.

As may be readily visualized, when a bayonette-style lamp is inserted in the lamp socket housing 100, an electrical connection is made to one terminal of the filament by the contact member 126, the upper coil 129 of which contacts a terminal at the center of the base of the inserted lamp. As already stated, one end of the lamp filament is connected to the portion of the base from which the studs extend and the other end of the filament within the lamp is connected to a terminal at the center bottom of the lamp.

Figures 6, 7:
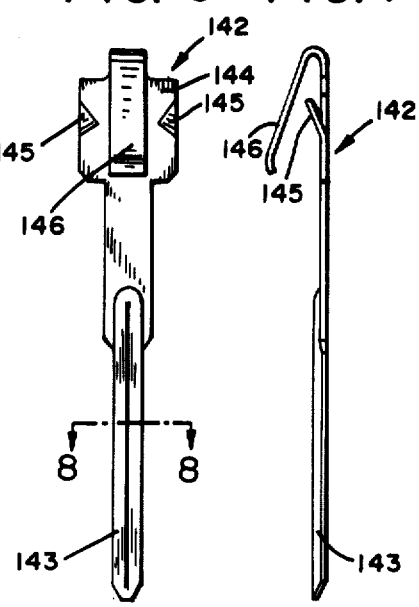
FIGS. 6 and 7 comprise two views of a contact member used in the invention.

The second connection to the lamp is accomplished by means of contact member 142 which is shown in front and side views in FIGS. 6 and 7. In addition, the contact member 142 is shown in position in FIG. 4. However, the contact member 142 is not illustrated in other figures in order to avoid making them unduly complex and confusing. As may be readily perceived from an examination of FIGS. 6, 7, and 8, the contact member 142 may be readily fabricated from flat stock. The contact member 142 will include a terminal portion 143 which will project through hole 109 in the base 104 of the socket housing 100. The terminal 143 will function in a manner substantially similar to that of the terminal 127 for making electrical connection with the foil of the printed circuit board or any other technique as may be suitable for the type of connection required. As may be seen from FIGS. 6, 7, and 8, the terminal portion 143 of the contact member 142 may be fabricated with a rib in order to strengthen the terminal portion 143. At the upper end of the contact member 142, there is a shoulder portion 144 which, as may be readily perceived, will fit into the left and right guideways 106 and 107. Formed from the shoulder portions are barbs 145 which will serve, in a well-known manner, to lock the contact member 142 in position against removal thereof. That is, because of the direction of orientation of the barbs 145, the contact member 142 may be readily inserted into the elongated slot 108 and the left and right guideways 106 and 107 and serve to inhibit removal of the contact member 142. At the upper end of the contact member 142, there is a formed finger 146 which projects into the central opening of the cylinder 101 for making contact with the base of the lamp inserted in the lamp socket housing 100.

As thus far described, the lamp socket housing 100 may be used for mounting on a printed circuit board by inserting the terminals 127 and 143 through holes on the printed circuit board. The housing 100 could also be mounted to a chassis by modifying the appendage 105 to include a clip 150 shown in FIG. 4 but not any of the other figures. The clip 150 could slide over the edge of a chassis, indicated as 151, and secure the housing 100 thereto.

An alternate technique for mounting the lamp socket 100 is to provide the appendage 105 with undercut sides 111, as indicated in FIG. 1, so that the appendage 105 could be slid into a mating keyway of another assembly. Other techniques for mounting the lamp socket 100 will readily occur to those familiar with the utilization and mounting of lamp sockets of the class described.

It is contemplated that the terminals 127 and 143 will have a maximum side to side dimension which is smaller than the holes of the printed circuit board through which they may be placed. A reason for this relationship is to avoid the possibility of the insertion of the terminals through the printed circuit board, loosening the foil on the board. However, a concomitant disadvantage is that the lamp socket 100 might become disassociated from the printed circuit board between the time that the lamp socket 100 is associated therewith and the soldering operation is completed. In order to reduce the probability of this disassociation and retain the lamp socket 100 on the printedcircuit board, at least one of the terminals 127 or 143 may be formed as illustrated in FIG. 9. As may be seen, FIG. 9 comprises a view of the lower left portion of FIG. 4 with the terminal 127 inserted through the hole 110 of the bottom 104 and through a hole 155 in a printed circuit board 156. The terminal 127 will yield sufficiently to allow its insertion in the hole 155, but because of the arcuate shape of the terminal 127, it will serve to retain the lamp socket 100 on the printed circuit board 156.

The lamp socket 100 as described hereinabove is suitable for accommodating bayonette-style lamps. However, it will be appreciated, by those familiar with lamps and sockets of the class under consideration, that there are at least two other types of lamp bases in fairly wide use. Another common lamp base is a miniature version of the ubiquitous incandescent lamp found in homes. That is, the base includes threads. To accommodate lamps of this type, it would be possible to fabricate the lamp socket 100 to include threads. As an alternative, the socket could be designed with one or more latches having some similarity with latch 115, but adapted to engage the threads of the lamp base. Alternatively, a threaded base lamp could be retained in position by molding into the cylinder 101 a plurality of dimples which are positioned and configured to mate with the lamp threads and as indicated by dimples 112 in FIG. 5. In order to limit the depth of the insertion of a lamp with a threaded base, stops 113 could be provided. The dimples 112 and stops 113 are illustrated in FIG. 5 only and are not shown in other figures.

Another type of lamp that is sometimes used is a variety of the bayonette-type base which has two electrical contacts at the lower end. Sometimes these are double filament lamps and the shell portion of the base carrying the studs comprises a third terminal. If it is desired to provide a lamp socket which will accommodate three-terminal, bayonette-style lamps, it will be necessary to modify the contact member 126 so that the upper coil 129 is appropriately displaced to the side when the contact member 126 is captured in position by the locking tabs 119. The structure would then include a second appendage somewhat similar to appendage 105 which would support and capture a third contact member (not shown) which would include a finger appropriately positioned and supported for contacting the second contact at the base of the lamp. A lamp socket incorporating this feature would comprise four parts. Alternatively, it would be possible to modify the appendage 105 and the position of the left and right guideways 106 and 107 to accommodate a second set of guideways for supporting the third terminal.

Other modifications for adapting the lamp socket 100 to satisfy alternate configurations and requirements will readily occur to those having appropriate knowledge of the applicable arts.

While there has been shown and described what is considered at present to be the preferred embodiments of the invention, modifications thereto will readily occur to those skilled in the related arts. For example, in another structure the contact member 142 could be embedded in the molded housing. Or, if required by the exigencies of the interior configuration of the lamp socket, it could be made of two pieces which snap together or a hinged structure used. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodiments shown and described, and it is intended to cover in the appended claims all such modifications as fall within the true spirit and scope of the invention.

What is claimed is:

1. A lamp socket for accommodating a lamp and comprising in combination:
   (a) a non-conducting housing having a side wall and a base and adapted to accommodate a lamp;
   (b) a first contact member captured by cooperative coaction with said side wall of said housing and in a predetermined relationship with respect thereto and including:
      (1) a first portion projecting inward from said side wall for contacting the base of a lamp inserted into said housing; and
      (2) a second portion projecting through a first opening in said base of said housing for accommodating an external electrical connection;
   (c) a second contact member captured by cooperative coaction with said housing and including:
      (1) a first section comprising a spring projecting longitudinally upward from said base of said housing for contacting the base contact of a lamp inserted in said housing; and
      (2) a second section projecting through a second opening in said base of said housing for accommodating an external electrical connection; and wherein
   (d) at least one of said second portion and said second section, comprises a non-linear yielding member for coacting with a printed circuit board, when said lamp socket is placed in cooperative engagement therewith by placing said second portion and said second section through cooperating openings of the printed circuit board, each opening of which is larger in cross section than the associated second portion or second section, respectively, whereby to secure said lamp socket to the printed circuit board prior to soldering by the coaction of the yielding member with a portion of the perimeter of the associated opening.

2. The combination as set forth in claim 1 wherein said side wall of said housing includes a guideway in which said first contact member is captured when it is inserted therein because a barb on said contact member is oriented to coact with said guideway for inhibiting movement of said contact member in a direction to remove said contact member from said housing.

3. The combination as set forth in claim 2 wherein said first contact member is formed from planar stock.

4. The combination as set forth in claim 3 wherein said first contact member comprises:
   (a) a generally rectangular portion configured to mate with said housing guideway; and wherein
   (b) said first portion projects from an upper end of said rectangular portion and is folded over so the free end of said first portion projects downward and inward of said housing so the folded over area does not interfere with the insertion of a lamp while the free end is positioned to assure contact with the base of an inserted lamp; and wherein
   (c) said second portion projects from a lower end of said rectangular portion.

5. The combination as set forth in claim 4 wherein said second portion is strengthened against deformation by formation of a longitudinal rib thereon.

6. The combination as set forth in claim 5 wherein said barb is formed on said rectangular section and coacts with said guideway for capturing said first contact member in said housing.

7. The combination as set forth in claim 1 wherein said housing comprises a generally cylindrical shape closed at said base thereof except for said first and second openings which accommodate said second portion and said second section, respectively.

8. The combination as set forth in claim 7 wherein said guideway comprises an appendage on said housing which is otherwise cylindrical; said appendage being positioned generally parallel to the axis of said cylinder.

9. The combination as set forth in claim 8 wherein said housing includes, as an integral part thereof, a spring finger having an inward projecting member for coaction with a coil of said first section to capture said first section within said housing.

10. The combination as set forth in claim 9 wherein said housing includes interior "J"-shaped guideways for cooperation with the studs of a bayonette lamp inserted in said housing.

11. The combination as set forth in claim 10 wherein at least a part of said "J"-shaped guideway does not penetrate the wall of said housing.

12. The combination as set forth in claim 11 wherein said part of said "J"-shaped guideway comprises at least the uppermost portion of said "J"-shaped guideway.

13. The combination as set forth in claim 1 wherein said housing includes retaining means for retaining said lamp socket on an external support member.

14. The combination as set forth in claim 13 wherein said retaining means comprises a clip formed as an integral part of said housing.

15. The combination as set forth in claim 12 wherein the external configuration of said appendage may coact with a keyway in a support member for securing said lamp socket to said support member.

16. The combination as set forth in claim 9 wherein said housing includes an interior guide for cooperation with the threads of a lamp having a threaded base.

17. The combination as set forth in claim 16 and including a stop member within said housing for coacting with the base of a threaded lamp to limit the depth of lamp penentration.

18. The combination as set forth in claim 17 wherein said interior guides comprises a plurality of dimples.

* * * * *